(12) United States Patent
Bratkovski et al.

(10) Patent No.: US 8,883,616 B2
(45) Date of Patent: Nov. 11, 2014

(54) GERMANIUM ON INSULATOR APPARATUS

(75) Inventors: Alexandre M. Bratkovski, Mountain View, CA (US); Leonid Tsybeskov, Rockaway, NJ (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 101 days.

(21) Appl. No.: 13/563,222

(22) Filed: Jul. 31, 2012

(65) Prior Publication Data

US 2014/0035104 A1 Feb. 6, 2014

(51) Int. Cl.
*H01L 21/20* (2006.01)
(52) U.S. Cl.
USPC .............. 438/480; 438/517; 257/E21.339
(58) Field of Classification Search
USPC ............................................... 438/480, 517
See application file for complete search history.

(56) References Cited

U.S. PATENT DOCUMENTS

| | | | |
|---|---|---|---|
| 6,391,695 B1 * | 5/2002 | Yu ................................. | 438/166 |
| 6,902,962 B2 * | 6/2005 | Yeo et al. ..................... | 438/150 |
| 7,515,793 B2 | 4/2009 | Dehlinger et al. | |
| 7,524,740 B1 * | 4/2009 | Liu et al. ..................... | 438/479 |
| 7,902,620 B2 | 3/2011 | Assefa et al. | |
| 7,919,381 B2 | 4/2011 | Nayfeh et al. | |
| 2010/0102412 A1 | 4/2010 | Suh et al. | |
| 2011/0084308 A1 | 4/2011 | Loh et al. | |

FOREIGN PATENT DOCUMENTS

WO WO-2008080428 A1 7/2008

OTHER PUBLICATIONS

Gupta, Ashawant, et al., Donor complex formation due to a highdose Ge implant into Si, American Institute of Physics, AIP: Journal of Applied Physics, 1994.
Matsumoto, Yasuhiro, et al., Short thermal annealing for crystallization of plasma-cvd amorphous silicon films, Sociedad Mexicana de Ciencia de Superficies y de Vacio, Jun. 5-8, 2000.

\* cited by examiner

*Primary Examiner* — Chandra Chaudhari

(57) ABSTRACT

In an implementation, a Germanium on insulator apparatus is fabricated by forming a patterned masking layer on a Silicon on insulator (SOI) layer that leaves a portion of the SOI layer exposed, implanting Germanium onto the exposed portion of the SOI layer to form a Silicon-Germanium island, depositing amorphous Germanium over the Silicon-Germanium island and the patterned masking layer, removing the patterned masking layer and the amorphous Germanium that was deposited onto the patterned masking layer to produce a Silicon-Germanium composite stripe, and annealing the Silicon-Germanium composite stripe to crystallize the amorphous Germanium in the Silicon-Germanium composite stripe.

13 Claims, 4 Drawing Sheets

GERMANIUM ON INSULATOR APPARATUS

BACKGROUND

Optical engines, such as transmitters and receivers, are typically coupled to single-mode optical fibers for the communication of data. The bandwidth-distance product for data communications systems using existing optical engines is around 2.5 Gpbs-km. Increasing the bandwidth-distance product above that value, for instance, to around 1 Tbps-km, such that the data communications systems may be implemented in large datacenter and campus networks often requires the use of signal regenerators, cascaded switches, or other relatively expensive alternatives. The use of such additional components adds to the cost and complexity of the data communications systems.

Conventional semiconductor and optoelectronic devices use Silicon on insulator (SOI); however, Germanium has been recognized as a superior material because Germanium has a very high carrier mobility and generally superior transport properties. For example, Germanium's electron mobility is two-fold larger and its hole mobility is four-fold larger relative to Silicon. However, it has been found to be difficult to implement Germanium and Silicon because they have different lattice structures, e.g., a Silicon-Germanium interface typically exhibits a lattice mismatch of about 4%. As a result, the resulting Germanium crystalline structure exhibits undesirable characteristics for many types of applications. For instance, conventional techniques for Germanium crystalline growth typically result in relatively large densities of defects.

BRIEF DESCRIPTION OF THE DRAWINGS

Elements of the present disclosure are illustrated by way of example and not limited in the following figure(s), in which like numerals indicate like elements, in which.

DETAILED DESCRIPTION

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Disclosed herein are methods for fabricating a Germanium on insulator (GOI) apparatus, such as an optoelectronic apparatus, and GOI apparatuses fabricated through implementation of the methods. In the methods, Germanium is selectively implanted into an SOI layer to form a Silicon-Germanium stripe, amorphous Germanium is deposited onto the Silicon-Germanium stripe, and a crystalline Silicon-Germanium composite stripe is formed. The Silicon-Germanium composite stripe is annealed to crystallize the amorphous Germanium in the Silicon-Germanium composite stripe. In one regard, the Silicon-Germanium stripe generally promotes amorphous Ge thermal crystallization and due to unavoidable intermixing, increases the Germanium concentration in the Silicon-Germanium composite stripe, therefore substantially improving the quality of the Germanium. One result of this enhancement is that the density of defects in the crystallized Germanium may be substantially reduced.

Through implementation of the methods and apparatuses disclosed herein, GOI apparatuses, such as optical engines, that provide improved characteristics over Silicon on insulator apparatuses may be fabricated. For instance, the GOI apparatuses disclosed herein may enable faster and greater network reach than is obtainable through use of Silicon on insulator apparatuses. In addition, the methods disclosed herein may enable relatively inexpensive and simple fabrication techniques for the GOI apparatuses.

Figure 1A:
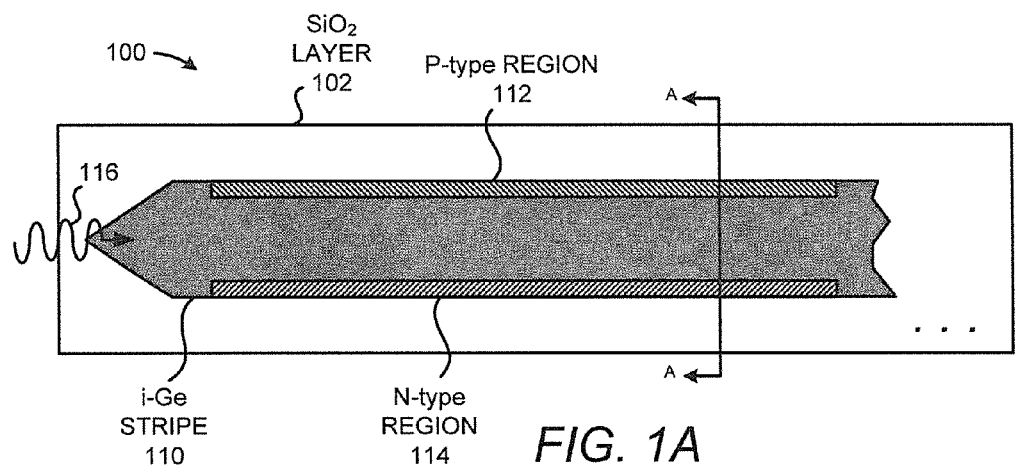
FIG. 1A shows a top view of a Germanium on insulator apparatus, according to an example of the present disclosure.

FIG. 1A shows a top view of a Germanium on insulator (GOI) apparatus 100, according to an example. It should be understood that the GOI apparatus 100 depicted in FIG. 1 may include additional components and that some of the components described herein may be removed and/or modified without departing from a scope of the GOI apparatus 100. It should also be understood that the components depicted in FIG. 1 are not drawn to scale and thus, the components may have different relative sizes with respect to each other than as shown therein.

According to an example, the GOI apparatus 100 comprises an avalanche photodetector or a lateral PIN junction that is to detect lightwaves 116. In other examples, the GOI apparatus 100 comprises other types of devices, such as an optical engine, a semiconductor device, an insulated-gate field-effect transistor (IGFET), etc. In any regard, the GOI apparatus 100 may include a gate that controls an underlying surface channel joining a source and a drain. In FIG. 1A, an intrinsic Germanium (i-Ge) stripe 110 forms part of the surface channel, a p-type region 112 may form the source, and a n-type region 114 may form the drain. The i-Ge stripe 110, the p-type region 112, and the n-type region 114 are also depicted as being positioned on a Silicon dioxide ($SiO_2$) layer 102. The p-type region 112 and the n-type region 114 may be doped oppositely to the $SiO_2$ layer 102 and may be located on either side of the i-Ge stripe 110, as shown in FIG. 1A. Alternatively, the p-type region 112 and the N-type region 114 may comprise separate electrodes as discussed in greater detail below with respect to FIG. 3I.

Figure 1B:
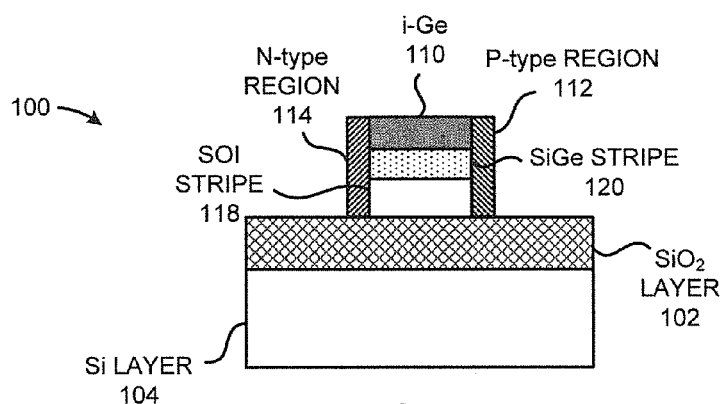
FIG. 1B shows an enlarged cross-sectional side view taken along lines A-A in FIG. 1A, according to an example of the present disclosure.

The gate is separated from the semiconductor substrate material by a thin insulating layer such as a gate oxide having a substantially uniform thickness. As shown in FIG. 1B, which is an enlarged cross-sectional side view taken along line A-A in FIG. 1A, the $SiO_2$ layer 102 is positioned on top of a Si layer 104. As also shown in FIG. 1B, the p-type region 112 and the n-type region 114 are located on either side of the i-Ge stripe 110 and are separated from the Si layer 104 by the $SiO_2$ layer 102. In addition, the i-Ge stripe 110, which comprises a crystalline form of Ge, is depicted as being positioned on top of a SiGe stripe 120 and a Silicon on Insulator (SOI) stripe 118. In addition, the SiGe stripe 120 and the SOI stripe 118 may be doped similarly to the i-Ge stripe 110 to form the p-type region 112 and the n-type region 114.

To operate the GOI apparatus 100, an input voltage is applied to its gate and, through the capacitive structure defined by the p-type region 112 and the n-type region 114 on either side of the SiO$_2$ layer 102, this input voltage causes a transverse electric field to be formed in the i-Ge stripe 110. The transverse electric field is generally uniform across the transverse axis of the GOI apparatus 100, which substantially reduces multiplication noise for avalanche. This electric field then modulates the longitudinal conductance of the i-Ge stripe 110 to electrically couple the p-type and n-type regions 112, 114.

According to a particular example, the GOI apparatus 100 is to absorb nearly 100% of light at wavelengths of about 1.3-1.5 µm. In addition, the i-Ge stripe 110 may have a length of about 20-40 µm, a width of about 500-600 nm, and a height of about 300 nm. Moreover, the GOI apparatus 100 may have a height of around 600 nm. In one regard, the i-Ge stripe 110 and the Si layer 104 depicted in FIGS. 1A-1B, as well as the p-type region 112 and the n-type region 114, are relatively elongated, which generally improves efficiency in the absorption of photons. In addition, the elongated configuration of these elements generally enhances sensitivity and controllability of the GOI apparatus 100.

Figure 2:
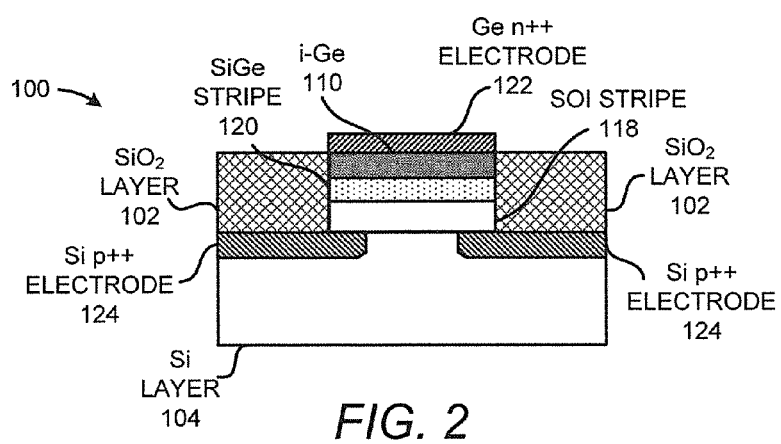
FIG. 2 shows a cross-sectional side view of a Germanium on insulator apparatus, according to another example of the present disclosure.

Turning now to FIG. 2, there is shown a cross-sectional side view of a GOI apparatus 100, according to another example. The GOI apparatus 100 depicted in FIG. 2 differs from the GOI apparatus 100 depicted in FIGS. 1A and 1B in that the GOI apparatus 100 depicted in FIG. 2 has a vertically arranged PIN geometry, whereas the GOI apparatus 100 depicted in FIGS. 1A and 1B has a laterally PIN arranged geometry. Additionally, the GOI apparatus 100 depicted in FIG. 2 may have similar dimensions to the GOI apparatus 100 depicted in FIGS. 1A and 1B.

As shown in FIG. 2, the GOI apparatus 100 includes a Si layer 104, with a pair of Si p++ electrodes 124 arranged on the Si layer 104 with a gap between the pair of Si p++ electrodes 124. A respective SiO$_2$ layer 106 is positioned on each of the Si p++ electrodes 124 and a channel exists between the SiO$_2$ layers 106. In addition, an i-Ge stripe 110, a SOI stripe 118, and a SiGe stripe 120 are positioned between the SiO$_2$ layers 102, and a Ge n++ electrode 122 is positioned on the i-Ge stripe 110. According to an example, the GOI apparatus 100 depicted in FIG. 2 comprises an elongated configuration similar to that depicted in FIG. 1A and discussed above.

Turning now to FIGS. 3A-3I, there are collectively shown cross-sectional side views of a GOI apparatus 100 during various stages of fabrication, according to an example. It should be understood that the fabrication stages depicted in FIGS. 3A-3I may include additional processes and that some of the processes described herein may be removed and/or modified without departing from a scope of the fabrication stages depicted in FIGS. 3A-3I.

Figure 3A:
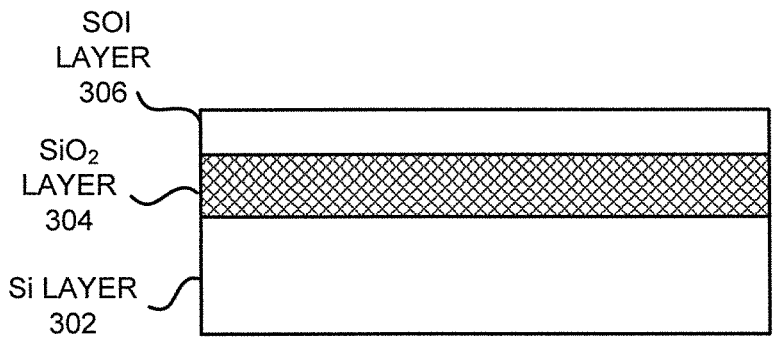
FIGS. 3A-3I, collectively, show cross-sectional side views of a Germanium on insulator apparatus during various stages of fabrication, according to an example of the present disclosure.

Beginning with FIG. 3A, there is shown a Si layer 302, a SiO$_2$ layer 304 positioned on the Si layer 302, and a SOI layer 306 positioned on the SiO$_2$ layer 304. The SiO$_2$ layer 304 may also be considered as a buried oxide layer (BOX). In addition, the layers 302-306 may be obtained as a composite structure and/or fabricated, e.g., layered, to form the composite structure depicted in FIG. 3A.

Figure 3B:
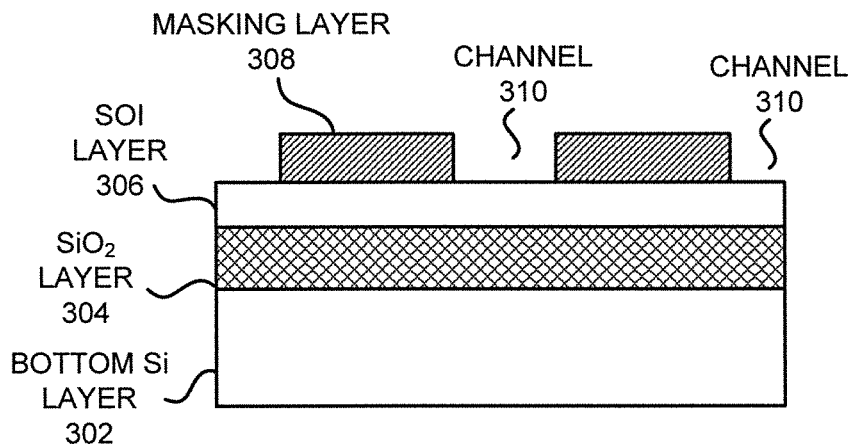

In FIG. 3B, a masking layer 308, for instance, a photoresist layer, is formed on the top Si layer 306. The masking layer 308 may be patterned to form a plurality of substantially linearly extending channels 310 between sections of the patterned masking layer 308. The masking layer 308 may be formed and patterned through any suitable techniques, such as photoresist patterning techniques.

Figure 3C:
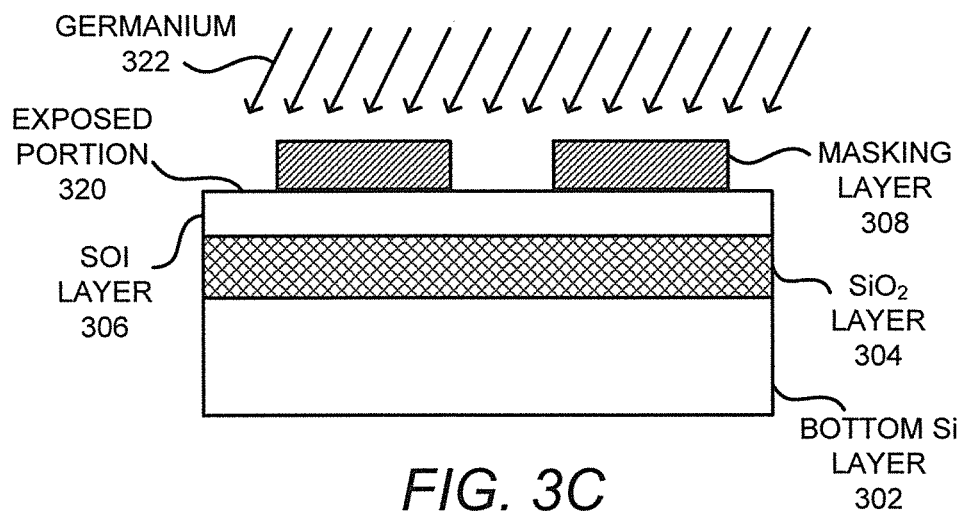

The portions of the SOI layer 306 that are uncovered by the masking layer 308, i.e., the channels 310, comprise exposed portions 320 of the SOI layer 306. In FIG. 3C, Ge$^+$ 322, as denoted by the arrows, is selectively implanted into the exposed portions 320 of the SOI layer 306. The Ge$^+$ 322 may be implanted into the exposed portions 320 of the SOI layer 306 through any suitable deposition technique, such as plasma enhanced chemical vapor deposition (CVD), sputtering, etc.

Figure 3D:
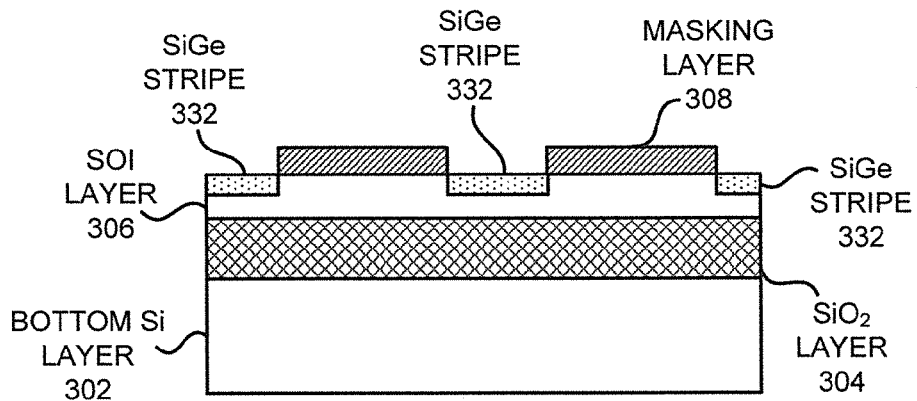

In FIG. 3D, the implanted Ge$^+$ 322 into the exposed portions 320 of the SOI layer 306 are depicted as forming Silicon-Germanium (SiGe) stripes 332 or islands. According to an example, the environmental conditions are sufficient to cause the amorphous Germanium to be implanted into the exposed portions 320 of the SOI layer 306. In one example, the amorphous Germanium is caused to be implanted into the SOI layer 306 through application of sufficient heat and pressure to cause the implantation to occur. In another example, a barrier for implantation may be implemented to cause the Ge$^+$ 322 to become implanted with the SOI layer 306. A particular example of a manner in which amorphous Germanium is implanted into Silicon is described in Gupta et al., "Donor Complex Formation Due to a High-Dose Ge Implant to Si," Journal of Applied Physics (ISSN 0021-8979), vol. 75, no. 8, p. 4252-4254, the disclosure of which is hereby incorporated by reference in its entirety. As may be seen in FIG. 3D, the SiGe stripes 332 may be formed in the SOI layer 306 without penetrating through the SOI layer 306 to the SiO$_2$ layer 304.

Figure 3E:
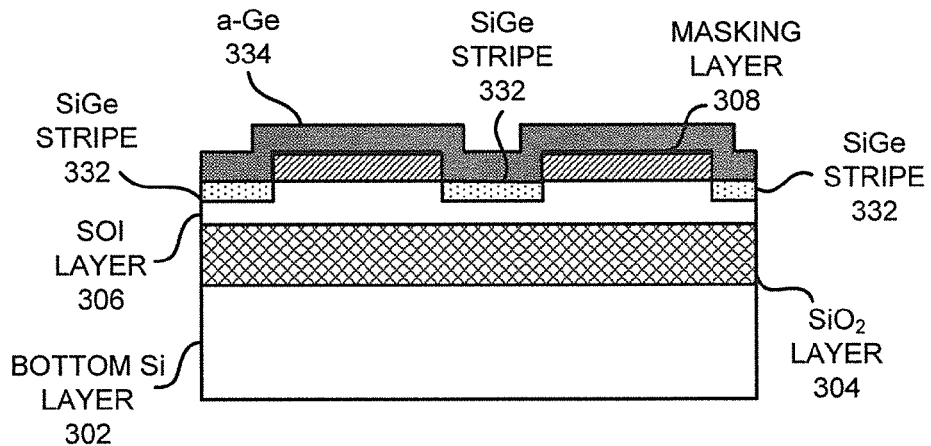

In FIG. 3E, a layer of amorphous Germanium (a-Ge) 334 is depicted as being deposited over the SiGe stripes 332 and the masking layer 308 sections. The a-Ge 334 may be deposited through any suitable deposition process, such as chemical vapor deposition (CVD), sputtering, etc.

Figure 3F:
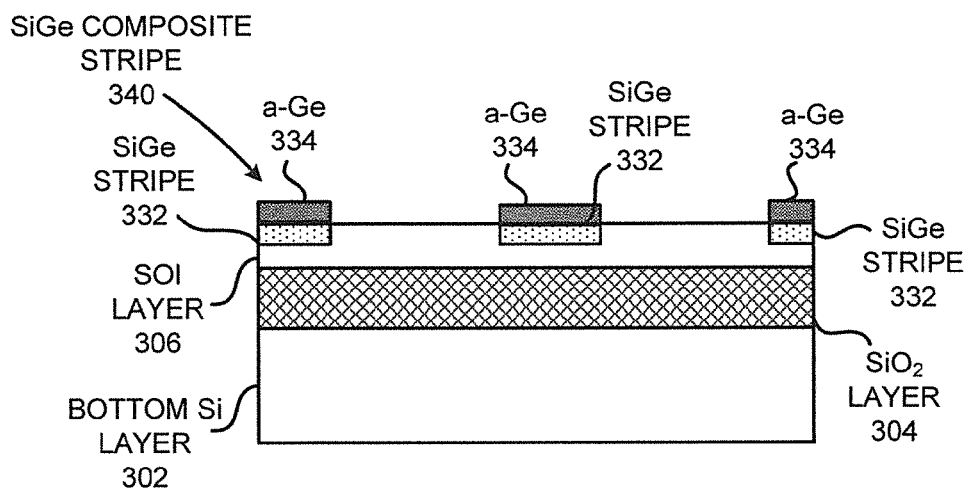

In FIG. 3F, the masking layer 308 sections and the a-Ge 334 sections that were deposited on the masking layer 308 are depicted as having been removed. The masking layer 308 sections and the a-Ge 334 sections that were deposited on the masking layer 308 sections may be removed through implementation of any suitable removal technique, such as dry etching. The combination of the SiGe stripe 332 and a-Ge 334 sections, as well as the portions of the SOI layer 306 between the SiGe stripes 332 and the SiO$_2$ layer 304, are herein referred as SiGe composite stripes 340.

Figure 3G:
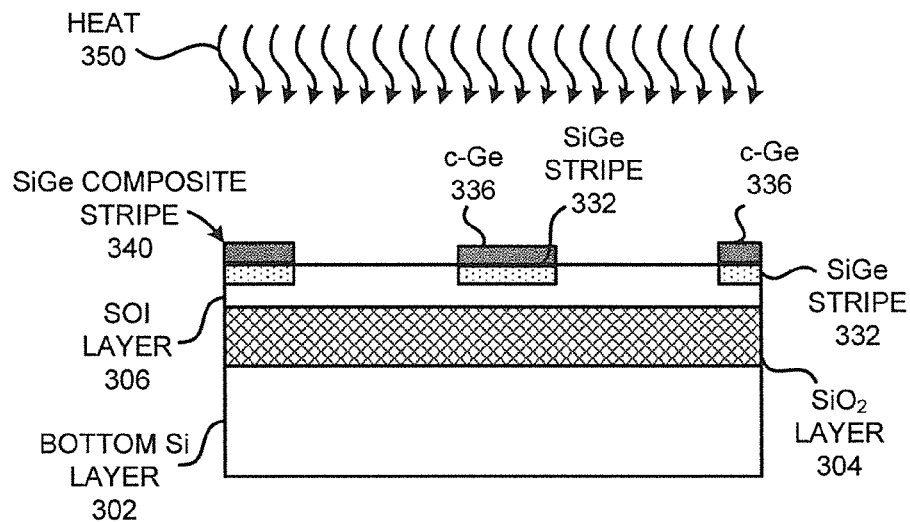

In FIG. 3G, the SiGe composite stripes 340 are depicted as being annealed to crystallize the a-Ge 334 contained in the SiGe composite stripes 340 through application of heat, as denoted by arrows 350. During the annealing process, the SiGe composite stripes 340 are exposed to sufficiently high temperature and oxygen levels to cause the phase of the SiGe composite stripes 340 to disaggregate. Particularly, the amount of heat and oxygen to which the SiGe composite stripes 340 are exposed are sufficient to cause the Si contained in the SiGe stripes 332 to flow to the tops of the SiGe composite stripes 340 and to oxidize to form silicon dioxide and for the Ge to flow to the bottoms of the SiGe composite stripes 340. During this process, the SiGe composite stripes 340 are converted into nearly a crystalline germanium (c-Ge) 336. Additionally, the a-Ge 334 will crystallize, releasing latent heat.

During the annealing process depicted in FIG. 3G, the SiGe stripes 332 increase the Germanium concentration in the SiGe composite stripes 340. In one regard, therefore, the SiGe stripes 332 generally enhance crystallization of the Germanium in the SiGe composite stripes 340 and thus improve composition control of the crystallized Germanium. In addition, the SiGe stripes 332 reduce the density of defects in the crystallized Germanium. Particularly, the SiGe stripes 332 are needed to reduce the lattice mismatch between Silicon and Germanium, which is approximately 4%. Thermal crystallization of an amorphous layer deposited on a lattice matched crystalline substrate typically produces a better quality material as discussed in Matsumoto et al., "Short Thermal Annealing for Crystallization of Plasma-CVD amorphous Silicon Films," Superficies y Vacio 10, Jun. 5-8, 2000, the disclosure of which is hereby incorporated by reference in its entirety.

Figure 3H:
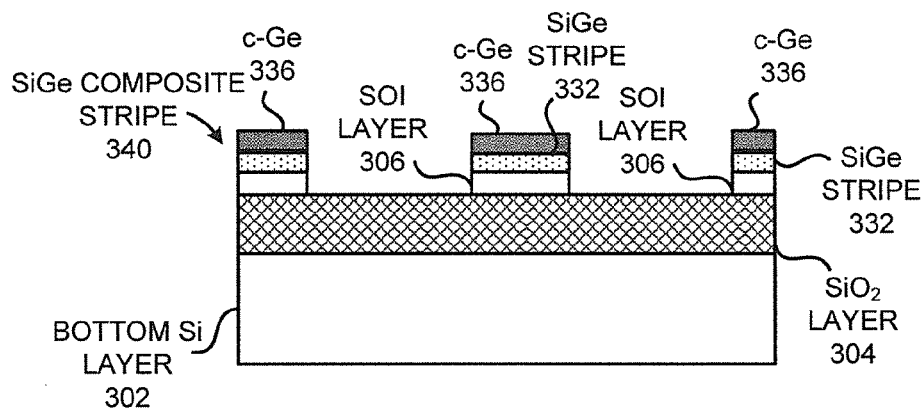

In FIG. 3H, the sections of the SOI layer 306 between the SiGe composite stripes 340 are depicted as having been removed. The sections of the SOI layer 306 may be removed through implementation of any suitable removal technique, such as dry etching.

Figure 3I:
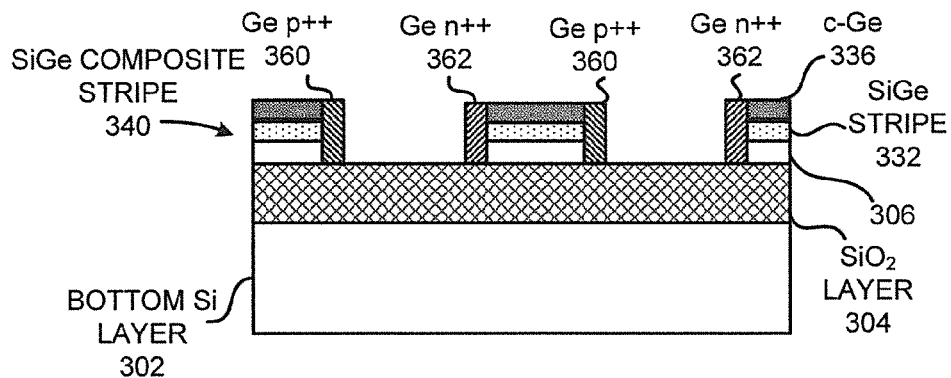

In FIG. 3I, side electrodes 360 and 362 are depicted as being formed on the sides of the SiGe composite stripes 340, which include the c-Ge 336 sections. Particularly, the electrodes comprise Ge heavily p-doped (p++) electrodes 360 and Ge heavily n-doped (n++) electrodes 362, which may be formed through angled deposition of the materials of the electrodes 360, 362. The Ge heavily p-doped (p++) electrodes 360 may be doped with acceptors such as Boron and the Ge heavily n-doped (n++) electrodes 360 may be doped with donors such as Phosphorous.

Additional operations may be performed on the elements depicted in FIG. 3I and/or some of the operations discussed above may be modified to fabricate an apparatus having the features of the GOI apparatus 100 depicted in any of FIGS. 1A, 1B, and 2. For instance, instead of the deposition of the electrodes 360, 362, the sides of SiGe composite stripes 340 may be doped as discussed above with respect to FIG. 1A. The various portions of the SiGe composite stripes 340 may be doped through use of any suitable doping technique.

As another example, and as shown in FIG. 2, a p-type (p++) electrode 124 may be formed in a Si layer 104 and a n-type (n++) electrode 122 may be formed on in the SiGe composite stripe 340, in which the SiGe composite stripe 340 is positioned between and in contact with the p-type (p++) electrode 124 and the n-type (n++) electrode 122. In addition, $SiO_2$ layers 102 may be provided on both sides of the SiGe composite stripe 340. In this example, the fabrication process depicted in FIGS. 3A-3I may be altered to include the formation of the p-type (p++) electrode 124 in the Si layer 104. However, the manner in which the composite stripe 340, which includes the SOI stripe 118, the SiGe stripe 120, and the c-Ge 336 (or equivalently, the i-Ge 110) is formed may remain the same.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A method for fabricating a Germanium on insulator apparatus, said method comprising:
   forming a patterned masking layer on a Silicon on insulator (SOI) layer that leaves a portion of the SOI layer exposed;
   implanting Germanium onto the exposed portion of the SOI layer to form a Silicon-Germanium island;
   depositing amorphous Germanium over the Silicon-Germanium island and the patterned masking layer;
   removing the patterned masking layer and the amorphous Germanium that was deposited onto the patterned masking layer to produce a Silicon-Germanium composite stripe; and
   annealing the Silicon-Germanium composite stripe to crystallize the amorphous Germanium in the Silicon-Germanium composite stripe.

2. The method according to claim 1, further comprising:
   patterning the masking layer to form a substantially linear channel to expose a substantially linearly extending portion of the SOI layer prior to implanting the Germanium onto the exposed portion of the SOI layer.

3. The method according to claim 2, wherein implanting Germanium onto the exposed portion of the SOI layer further comprises implanting the Germanium into the Silicon of the SOI layer in the exposed portion to form a substantially linearly extending Silicon-Germanium stripe, and wherein removing the patterned masking layer and the amorphous Germanium that was deposited onto the patterned masking layer further comprises etching the patterned masking layer and the amorphous Germanium that was deposited onto the patterned masking layer.

4. The method according to claim 1, further comprising:
   selectively depositing the Germanium onto the exposed portions of the SOI layer to form the Silicon-Germanium islands.

5. The method according to claim 1, further comprising:
   removing portions of the SOI layer around the Silicon-Germanium composite stripe, wherein the Silicon-Germanium composite stripe comprises a portion of the SOI layer between the Silicon-Germanium stripe and a SiO2 layer.

6. The method according to claim 5, further comprising:
   forming a first electrode on one side of the Silicon-Germanium composite stripe; and
   forming a second electrode on an opposite side of the Silicon-Germanium composite stripe.

7. The method according to claim 6, wherein forming the first electrode and the second electrode further comprises:
   forming the first electrode and the second electrode through angle deposition of an electrically conductive material.

8. The method according to claim 5, further comprising:
   doping one side of the Silicon-Germanium composite stripe to be a p-type region; and
   doping an opposite side of the Silicon-Germanium composite stripe to be a n-type region.

9. The method according to claim 5, further comprising:
   forming a first electrode in a Si layer, wherein the Silicon-Germanium composite stripe is formed to be in contact with the first electrode; and
   forming a second electrode on the Silicon-Germanium composite stripe, wherein the Silicon-Germanium composite stripe is positioned between the first electrode and the second electrode.

10. A method for fabricating an optoelectronic apparatus, said method comprising:
    forming a masking layer on a Silicon on insulator (SOI) layer;
    patterning the masking layer to form a plurality of substantially linear channels to expose substantially linearly extending portions of the SOI layer;

implanting Germanium onto the exposed portions of the SOI layer to form Silicon-Germanium stripes;

depositing amorphous Germanium over the Silicon-Germanium stripes and the patterned masking layer;

removing the patterned masking layer and the amorphous Germanium that was deposited onto the patterned masking layer to produce Silicon-Germanium composite stripes;

annealing the Silicon-Germanium composite stripes to crystallize the amorphous Germanium in the Silicon-Germanium composite stripes;

removing portions of the SOI layer around the Silicon-Germanium composite stripes, wherein each of the Silicon-Germanium composite stripes comprises a portion of the SOI layer between the Silicon-Germanium stripe and a SiO2 layer; and forming regions with respect to the Silicon-Germanium composite stripes for use in optoelectronic operations.

11. The method according to claim 10, wherein forming the regions further comprises:

forming a first electrode on one side of the Silicon-Germanium composite stripe; and forming a second electrode on an opposite side of the Silicon-Germanium composite stripe.

12. The method according to claim 10, wherein forming the regions further comprises:

doping one side of the Silicon-Germanium composite stripe to be a p-type region; and doping an opposite side of the Silicon-Germanium composite stripe to be a n-type region.

13. The method according to claim 10, further comprising:

forming a first region in a Si layer, wherein the Silicon-Germanium composite stripe is formed to be in contact with the first region; and forming a second region on the Silicon-Germanium composite stripe, wherein the Silicon-Germanium composite stripe is positioned between the first region and the second region.

* * * * *

UNITED STATES PATENT AND TRADEMARK OFFICE
CERTIFICATE OF CORRECTION

PATENT NO. : 8,883,616 B2 Page 1 of 1
APPLICATION NO. : 13/563222
DATED : November 11, 2014
INVENTOR(S) : Alexandre M. Bratkovski et al.

It is certified that error appears in the above-identified patent and that said Letters Patent is hereby corrected as shown below:

In the Claims

In column 6, line 36, in Claim 5, delete "SiO2" and insert -- $SiO_2$ --, therefor.

In column 7, line 16, in Claim 10, delete "SiO2" and insert -- $SiO_2$ --, therefor.

Signed and Sealed this
Twenty-sixth Day of May, 2015

Michelle K. Lee
*Director of the United States Patent and Trademark Office*